(12) United States Patent
Shimizu et al.

(10) Patent No.: US 9,679,971 B2
(45) Date of Patent: Jun. 13, 2017

(54) SEMICONDUCTOR DEVICE

(71) Applicant: Kabushiki Kaisha Toshiba, Minato-ku (JP)

(72) Inventors: Tatsuo Shimizu, Shinigawa (JP); Ryosuke Iijima, Setagaya (JP); Kazuto Takao, Tsukuba (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/252,432

(22) Filed: Aug. 31, 2016

(65) Prior Publication Data
US 2017/0077239 A1    Mar. 16, 2017

(30) Foreign Application Priority Data

Sep. 11, 2015  (JP) .................................. 2015-179034

(51) Int. Cl.
*H01L 29/15*    (2006.01)
*H01L 31/0312*    (2006.01)
*H01L 29/16*    (2006.01)
*H01L 29/45*    (2006.01)
*H01L 29/868*    (2006.01)

(52) U.S. Cl.
CPC .......... *H01L 29/1608* (2013.01); *H01L 29/45* (2013.01); *H01L 29/868* (2013.01)

(58) Field of Classification Search
CPC .............. H01L 29/868; H01L 21/0485; H01L 21/0495; H01L 29/47; H01L 29/45; H01L 29/66068; H01L 29/6606; H01L 29/872; H01L 29/1608
See application file for complete search history.

(56) References Cited

U.S. PATENT DOCUMENTS

| | | | | |
|---|---|---|---|---|
| 5,929,523 A | * | 7/1999 | Parsons | ............... H01L 21/0485 257/750 |
| 2003/0013319 A1 | * | 1/2003 | Holmes | ............... H01L 21/8221 438/761 |
| 2005/0258491 A1 | | 11/2005 | Bojarczuk et al. | |
| 2014/0103364 A1 | | 4/2014 | Nakano et al. | |
| 2016/0197193 A1 | * | 7/2016 | Shimomura | ............ H01L 29/24 257/43 |

FOREIGN PATENT DOCUMENTS

| | | |
|---|---|---|
| JP | 200-10164 A | 4/2000 |
| JP | 2005-328059 A | 11/2005 |
| JP | 2011-258760 A | 12/2011 |
| JP | 2014-003051 A | 1/2014 |

* cited by examiner

*Primary Examiner* — Thanh Y Tran
(74) *Attorney, Agent, or Firm* — Oblon, McClelland, Maier & Neustadt, L.L.P.

(57) ABSTRACT

A semiconductor device of an embodiment includes an n-type SiC region, a metal layer, and a conductive layer provided between the n-type SiC region and the metal layer, the conductive layer including titanium (Ti), oxygen (O), at least one first element from zirconium (Zr) and hafnium (Hf), and at least one second element from vanadium (V), niobium (Nb), and tantalum (Ta).

15 Claims, 9 Drawing Sheets

SEMICONDUCTOR DEVICE

CROSS-REFERENCE TO RELATED APPLICATION

This application is based upon and claims the benefit of priority from Japanese Patent Application No. 2015-179034, filed on Sep. 11, 2015, the entire contents of which are incorporated herein by reference.

FIELD

Embodiments described herein relate generally to a semiconductor device.

BACKGROUND

SiC (silicon carbide) is expected as a material for a next generation semiconductor device. SiC, compared with Si (silicon), has excellent physical properties of three times band gap, about ten times breakdown field strength, about three times thermal conductivity. By utilizing this property, it is possible to achieve a semiconductor device with a low loss and capable of high temperature operation.

However, in a semiconductor device using SiC, compared with a semiconductor device using Si, there is a problem that contact resistance increases between a semiconductor region and a metal electrode.

DETAILED DESCRIPTION

Figure 1:
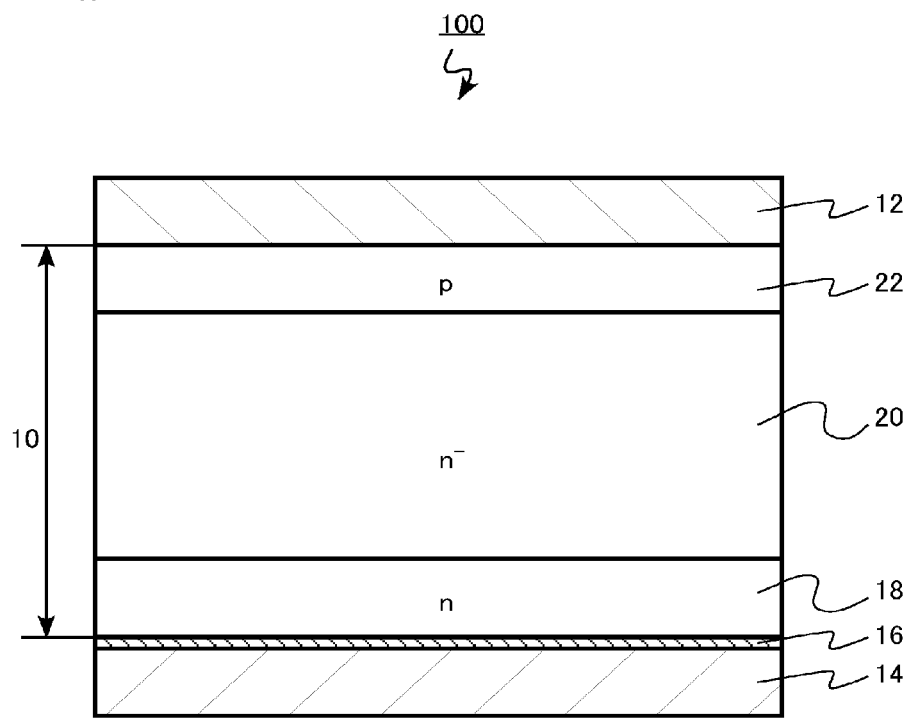
FIG. 1 is a schematic cross-sectional diagram illustrating a semiconductor device in a first embodiment.

A semiconductor device of an embodiment includes an n-type SiC region, a metal layer; and a conductive layer provided between the n-type SiC region and the metal layer, the conductive layer including titanium (Ti), oxygen (O), at least one first element from zirconium (Zr) and hafnium (Hf), and at least one second element from vanadium (V), niobium (Nb), and tantalum (Ta).

Hereinafter, embodiments of the present disclosure are described with reference to the drawings. Incidentally, in description below, the same or similar members are referenced by the same reference numerals, and the description of the members once described is appropriately omitted.

In addition, in the description below, notations of $n^+$, n, $n^-$, and $p^+$, p, $p^-$ represent relative elevations of impurity concentrations in respective conductivity types. That is, it represents that $n^+$ is relatively higher than n in an n-type impurity concentration, and $n^-$ is relatively lower than n in the n-type impurity concentration. In addition, it represents that $p^+$ is relatively higher than p in a p-type impurity concentration, and $p^-$ is relatively lower than p in the p-type impurity concentration. Incidentally, $n^+$-type, $n^-$-type may simply be referred to as n-type, and $p^+$-type, $p^-$-type may simply be referred to as p-type.

First Embodiment

A semiconductor device of the present embodiment includes an n-type SiC region, a metal layer, and a conductive layer provided between the n-type SiC region and the metal layer. The conductive layer includes titanium (Ti), oxygen (O), at least one first element from zirconium (Zr) and hafnium (Hf), and at least one second element from vanadium (V), niobium (Nb), and tantalum (Ta).

FIG. 1 is a schematic cross-sectional diagram illustrating a configuration of a PIN diode being a semiconductor device of the present embodiment.

A PIN diode 100 includes an SiC layer 10, an anode electrode 12, a cathode electrode (metal layer) 14, and a conductive layer 16. The SiC layer 10 includes a cathode region (n-type SiC region) 18, a drift region 20, and an anode region 22.

The SiC layer 10 is of SiC whose crystal structure is 4H-SiC. The 4H-SiC is a hexagonal crystal system.

The SiC layer 10 has a first plane and a second plane. In FIG. 1, the first plane is an upper plane of the figure, and the second plane is a lower plane of the figure. The first plane is referred to as a front plane, and the second plane is referred to as a back plane.

An example is described of a case in which the first plane is a plane inclined to a (0001) face by equal to or greater than 0 degrees and equal to or less than 8 degrees, and the second plane is a plane inclined to (000-1) face by equal to or greater than 0 degrees and equal to or less than 8 degrees. The (0001) face is referred to as a silicon face. The (000-1) face is referred to as a carbon face.

The cathode region (n-type SiC region) 18 is of n-type SiC. The cathode region 18 contains, for example, nitrogen (N) as an n-type impurity. A concentration of the n-type impurity of the cathode region 18 is equal to or greater than $1 \times 10^{18}$ cm$^{-3}$ and equal to or less than $1 \times 10^{21}$ cm$^{-3}$.

From a viewpoint of reducing contact resistance between the cathode electrode (metal layer) 14 and the cathode region 18, a concentration of the n-type impurity in the second plane of the cathode region 18 is desirably equal to or greater than $1 \times 10^{19}$ cm$^{-3}$, and is more desirably equal to or greater than $1 \times 10^{20}$ cm$^{-3}$.

The drift region 20 is provided on the cathode region 18. The drift region 20 is of, for example, $n^-$-type SiC formed by epitaxial growth on the cathode region 18. Thickness of the drift region 20 is, for example, equal to or greater than 5 μm and equal to or less than 150 μm.

The drift region 20 contains, for example, nitrogen (N) as an n-type impurity. A concentration of the n-type impurity of the drift region 20 is, for example, equal to or greater than $5 \times 10^{15}$ cm$^{-3}$ and equal to or less than $2 \times 10^{16}$ cm$^{-3}$.

The anode region 22 is provided on the drift region 20. The anode region 22 is of, for example, p-type SiC formed by epitaxial growth on the drift region 20. Thickness of the anode region 22 is, for example, equal to or greater than 0.2 μm and equal to or less than 0.6 μm.

The anode region 22 contains, for example, aluminum (Al) as a p-type impurity. An impurity concentration of the anode region 22 is, for example, equal to or greater than $1\times10^{18}$ cm$^{-3}$ and equal to or less than $1\times10^{21}$ cm$^{-3}$.

From a viewpoint of reducing contact resistance between the anode electrode 12 and the anode region 22, the concentration of the n-type impurity in the second plane of the cathode region 18 is desirably equal to or greater than $1\times10^{19}$ cm$^{-3}$, and is more desirably equal to or greater than $1\times10^{20}$ cm$^{-3}$.

The anode electrode 12 is provided on the front plane of the SiC layer 10. The anode electrode 12 is provided on the anode region 22. The anode electrode 12 is electrically connected with the anode region 22.

The anode electrode 12 is of metal. The metal forming the anode electrode 12 is of, for example, a laminated structure of titanium (Ti) and aluminum (Al). The metal forming the anode electrode 12 may react with the SiC layer 10 to form metal silicide or metal carbide.

The cathode electrode (metal layer) 14 is provided on the back plane of the SiC layer 10. The cathode electrode 14 is electrically connected with the cathode region 18.

The cathode electrode 14 is of metal. The metal forming the cathode electrode 14 is of, for example, titanium nitride (TiN).

The conductive layer 16 is provided between the cathode region (n-type SiC region) 18 and the cathode electrode (metal layer) 14. The conductive layer 16 is in contact with the cathode region 18. The conductive layer 16 is in contact with the cathode electrode 14.

The conductive layer 16 contains titanium (Ti) and oxygen (O). In addition, the conductive layer 16 contains zirconium (Zr) or hafnium (Hf). In addition, the conductive layer 16 contains at least one element selected from the group consisting of vanadium (V), niobium (Nb), and tantalum (Ta).

The conductive layer 16 is of metal oxide. The conductive layer 16 is of, for example, titanium oxide. The conductive layer 16 is of, for example, (Ti,Zr,Hf)O$_3$. The conductive layer 16 is of polycrystal or amorphous.

Thickness of the conductive layer 16 is, for example, equal to or greater than 10 nm and equal to or less than 100 nm.

An atomic ratio of titanium to titanium, zirconium, and hafnium in the conductive layer 16 (Ti/(Ti+Zr+Hf)) is desirably equal to or greater than 0.5 and equal to or less than 0.8, and is more desirably equal to or greater than 0.6 and equal to or less than 0.7.

Due to the fact that an element is added to metal oxide, the metal oxide includes conductivity. For example, due to the fact that vanadium (V), niobium (Nb), or tantalum (Ta), which becomes an n-type impurity by substituting titanium (Ti), zirconium (Zr), or hafnium (Hf), is added to metal oxide, the metal oxide includes n-type conductivity in which an electron is a carrier.

A concentration of the element in the conductive layer 16 is, for example, equal to or greater than $1\times10^{18}$ cm$^{-3}$ and equal to or less than $1\times10^{21}$ cm$^{-3}$. The concentration of the element in the conductive layer 16, from a viewpoint of reducing electric resistance of the conductive layer 16, is desirably equal to or greater than $1\times10^{19}$ cm$^{-3}$, and is more desirably equal to or greater than $1\times10^{20}$ cm$^{-3}$.

It is possible to identify a type of the element, amount of the element, atomic ratio of the element contained in the conductive layer 16, by Secondary Ion Mass Spectrometry (SIMS).

The conductive layer 16 can be formed, for example, by a sputtering method at equal to or less than 400° C. In this state, the conductive layer 16 is of amorphous. After that, crystallization annealing (600° C. to 800° C.) can be performed. In addition, a polycrystalline film can be formed by growing the film to have good coverage, with a CVD method, and performing crystallization annealing. At that time, although the polycrystalline film can be columnar in the film thickness direction, if the polycrystalline film is made to be a laminated structure of two or more layers in which sizes of columns are varied, uniformity in a film plane of electrical properties of the film is increased. The laminated structure in which the sizes of the columns are varied can be formed by performing a plurality of times of deposition, as deposition, crystallization, deposition (condition of different temperature), crystallization. This is the same in the following embodiments.

Hereinafter, the function and effect are described of the semiconductor device of the present embodiment.

To increase ON-state current of the PIN diode 100, it is desirable to reduce the contact resistance between the anode electrode 12 and the anode region 22, or the cathode electrode 14 and the cathode region 18. To reduce the contact resistance, it is desirable to achieve ohmic contact.

The cathode region 18 is of n-type SiC. To achieve the ohmic contact between the cathode electrode 14 and the cathode region 18, it is desirable that a work function of the metal forming the cathode electrode 14 coincides with electron affinity of SiC. In this case, an energy barrier disappears between the cathode electrode 14 and the cathode region 18, so that the ohmic contact can be achieved.

Incidentally, the work function is an energy difference between a vacuum level (the energy level of the vacuum) and a Fermi level of a targeted substance. In addition, the electron affinity is a difference between the vacuum level (the energy level of the vacuum) and an energy level of the lower end of the conduction band of the targeted substance.

In a case of 4H-SiC, the electron affinity is 3.60 eV. Therefore, the ohmic contact can be achieved by applying a metal whose work function is approximately 3.60 eV for the metal forming the cathode electrode 14.

However, in the metal whose work function is approximately 3.60 eV, from a viewpoint of resistance to oxidation, resistance to moisture, and the like, there is no suitable metal as an electrode for contact. In addition, the cathode electrode 14, after forming the anode electrode 12 on the front plane of the SiC layer 10, is formed on the back plane of SiC layer 10. Because of this, it is desirable that the ohmic contact between the cathode electrode 14 and the cathode region 18 can be formed by a low temperature process.

Figure 2:
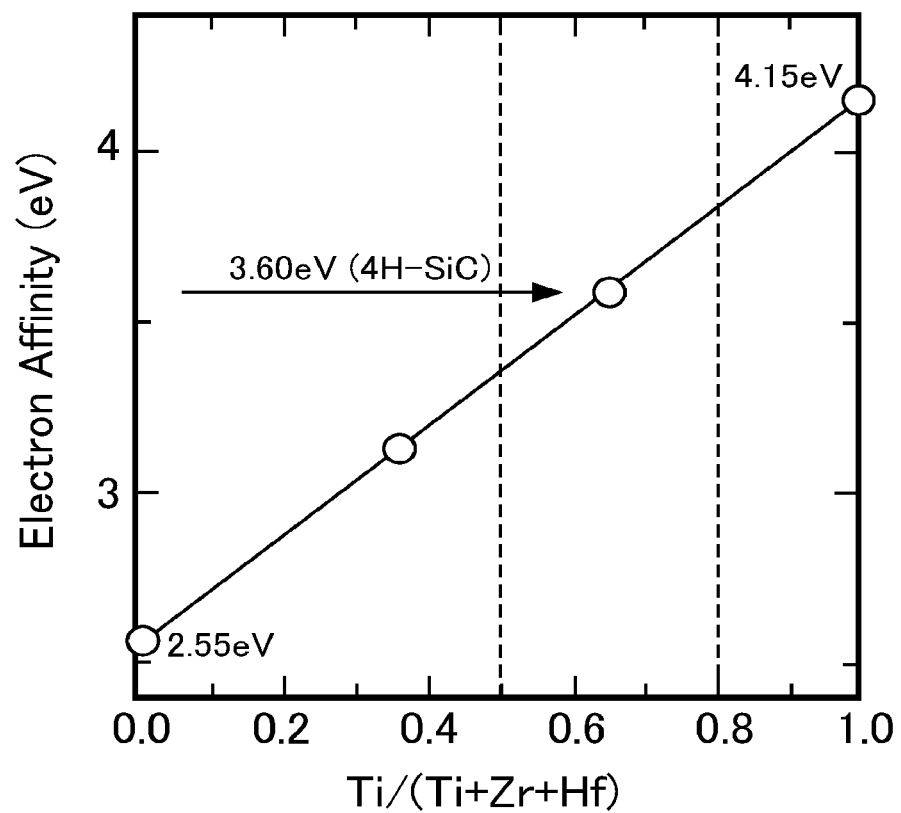
FIG. 2 is an explanatory diagram of a function and effect of the semiconductor device in the first embodiment.
Figure 3:
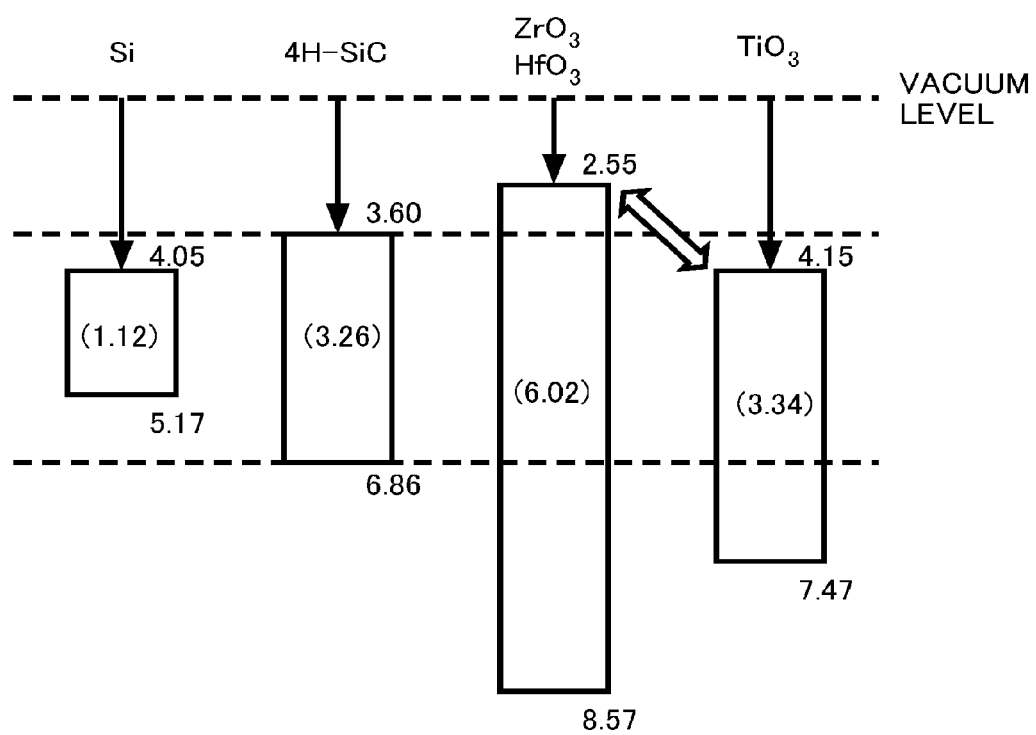
FIG. 3 is an explanatory diagram of the function and effect of the semiconductor device in the first embodiment.

FIG. 2, FIG. 3 are explanatory diagrams of the function and effect of the semiconductor device of the present embodiment.

FIG. 2 is a diagram illustrating a change of electron affinity of titanium oxide when zirconium (Zr) or hafnium (Hf) is added to the titanium oxide. The electron affinity is calculated by using first principles calculation. Incidentally, when metal oxide such as titanium oxide is metalized by introducing an n-type impurity, it can be regarded that the Fermi level of the titanium oxide coincides with the energy level of the lower end of the conduction band. Because of this, it is possible to regard that the work function of the metal oxide coincides with the electron affinity.

FIG. 3 is a diagram illustrating energy band structure of silicon (Si), 4H-SiC, zirconium oxide (ZrO$_3$), hafnium oxide (HfO$_3$), titanium oxide (TiO$_3$). FIG. 3 illustrates the energy difference (electron affinity) between the vacuum level and the lower end of the conduction band, the energy difference between the vacuum level and the upper end of the valence band, band gap energy of each material. In the figure, the numeric value in parentheses represents the band gap energy.

As illustrated in FIG. 2, as a result of the first principles calculation by the inventors, it has been revealed that the electron affinity is changed in a direction to be reduced by adding zirconium (Zr) or hafnium (Hf) to titanium oxide. When zirconium (Zr) or hafnium (Hf) is not added, that is, when it is titanium oxide, the electron affinity is 4.15 eV. On the other hand, when titanium (Ti) of titanium oxide is entirely substituted by zirconium (Zr) or hafnium (Hf), that is, when it is zirconium oxide or hafnium oxide, the electron affinity is lowered to 2.55 V.

As illustrated in FIG. 3, by adding zirconium (Zr) or hafnium (Hf) to titanium oxide, it is possible to set the electron affinity to any value between 2.55 eV and 4.15 eV, which is indicated by a white arrow. In other words, by changing the atomic ratio of titanium to titanium, zirconium, and hafnium (Ti/(Ti+Zr+Hf)) of (Ti,Zr,Hf)$O_3$, it is possible to set the electron affinity to any value between 2.55 eV and 4.15 eV, which is indicated by the white arrow. In particular, by making Ti/(Ti+Zr+Hf)=0.64, it is possible to allow the electron affinity to coincide with electron affinity of 4H-SiC, 3.60 eV.

In the present embodiment, the conductive layer 16 is provided between the cathode electrode 14 and the cathode region 18. In the conductive layer 16, zirconium (Zr) or hafnium (Hf) is added to a metal oxide containing titanium. Thus, the work function is reduced in comparison with a case in which metal oxide does not contain zirconium (Zr) or hafnium (Hf). Therefore, the work function of the conductive layer 16 can be made closer to the electron affinity of 4H-SiC, 3.60 eV. Therefore, a barrier is lowered between the cathode region 18 and the conductive layer 16, and contact resistance is reduced between the cathode region 18 and the conductive layer 16.

Since contact between the conductive layer 16 and the cathode electrode 14 becomes contact between metal and metal, a low contact resistance is achieved. The contact between the conductive layer 16 and the cathode electrode 14 becomes the ohmic contact. Since the contact between the conductive layer 16 and the cathode electrode 14 becomes the contact between metal and metal, it is possible to select a metal material forming the cathode electrode 14 without considering the contact resistance to the cathode region 18.

From a viewpoint of reducing contact resistance between the cathode region 18 and the conductive layer 16 to achieve the ohmic contact, the atomic ratio of titanium to titanium, zirconium, and hafnium in the conductive layer 16 (Ti/(Ti+Zr+Hf)) is desirably equal to or greater than 0.5 and equal to or less than 0.8, and is more desirably equal to or greater than 0.6 and equal to or less than 0.7. If the atomic ratio (Ti/(Ti+Zr+Hf)) is equal to or greater than 0.5 and equal to or less than 0.8, it is possible to regulate the work function of the conductive layer 16 in a range of 3.60 eV±10%.

In addition, from the viewpoint of reducing the contact resistance between the cathode region 18 and conductive layer 16 to achieve the ohmic contact, the concentration of the n-type impurity in the second plane of the cathode region 18 is desirably equal to or greater than $1\times10^{19}$ cm$^{-3}$, and is more desirably equal to or greater than $1\times10^{10}$ cm$^{-3}$.

As described above, according to the present embodiment, the PIN diode 100 is achieved of a low contact resistance between the cathode electrode 14 and the cathode region 18.

In addition, the conductive layer 16 of the present embodiment can be deposited by, for example, the sputtering method at equal to or less than 400° C. In this state, the conductive layer 16 is of amorphous. After that, crystallization annealing (600° C. to 800° C.) can be performed. In addition, a polycrystalline film can be formed by growing the film to have good coverage, with a CVD method, and performing crystallization annealing. At that time, although the polycrystalline film can be columnar in the film thickness direction, if the polycrystalline film is made to be the laminated structure of two or more layers in which the sizes of the columns are varied, the uniformity in the film plane of the electrical properties of the film is increased. In particular, for the PTCR effect, it is important that a polycrystalline interface uniformly exists, and it is effective to make the laminated structure of the polycrystalline film of two or more layers in which the sizes of columns are varied. This is the same in the following embodiments. Therefore, the PIN diode 100 is achieved of the low contact resistance with a relatively low temperature process.

Second Embodiment

A semiconductor device of the present embodiment includes an n-type SiC region, a metal layer, and a conductive layer provided between the n-type SiC region and the metal layer. The conductive layer includes titanium (Ti), oxygen (O), at least one first element from zirconium (Zr) and hafnium (Hf), at least one metal element from calcium (Ca), strontium (Sr), and barium (Ba), and at least one second element from vanadium (V), niobium (Nb), tantalum (Ta), scandium (Sc), yttrium (Y), and lanthanoid.

The semiconductor device of the present embodiment is the same as the semiconductor device of the first embodiment, except that the conductive layer contains at least one metal element selected from the group consisting of calcium (Ca), strontium (Sr), and barium (Ba), and that elements are different from those that can be contained in the conductive layer. Therefore, description is omitted of contents overlapping with those of the first embodiment.

The semiconductor device of the present embodiment is a PIN diode. The PIN diode of the present embodiment is described with reference to FIG. 1.

A conductive layer 16 is provided between a cathode region (n-type SiC region) 18 and a cathode electrode (metal layer) 14. The conductive layer 16 is in contact with the cathode region 18. The conductive layer 16 is in contact with the cathode electrode 14.

The conductive layer 16 contains at least one metal element selected from the group consisting of calcium (Ca), strontium (Sr), and barium (Ba). In addition, the conductive layer 16 contains titanium (Ti) and oxygen (O). In addition, the conductive layer 16 contains zirconium (Zr) or hafnium (Hf). In addition, the conductive layer 16 contains at least one element selected from the group consisting of vanadium (V), niobium (Nb), tantalum (Ta), scandium (Sc), yttrium (Y), and lanthanoid.

The conductive layer 16 is of metal oxide. The conductive layer 16 is of, for example, calcium titanate, strontium titanate, barium titanate, or a composite thereof. The conductive layer 16 is of, for example, (Ca,Sr,Ba) (Ti,Zr,Hf)$O_3$ including perovskite structure. The conductive layer 16 is of polycrystal or amorphous.

Thickness of the conductive layer 16 is, for example, equal to or greater than 10 nm and equal to or less than 100 nm.

An atomic ratio of titanium to titanium, zirconium, and hafnium in the conductive layer 16 (Ti/(Ti+Zr+Hf)) is desirably equal to or greater than 0.5 and equal to or less than 0.8, and is more desirably equal to or greater than 0.6 and equal to or less than 0.7.

Due to the fact that an element is added to metal oxide, the metal oxide includes conductivity. For example, due to the fact that vanadium (V), niobium (Nb), or tantalum (Ta), which becomes an n-type impurity by substituting titanium (Ti), zirconium (Zr), or hafnium (Hf), is added to metal oxide, the metal oxide includes n-type conductivity in which an electron is a carrier. In addition, for example, due to the fact that scandium (Sc), yttrium (Y), or lanthanoid, which become the n-type impurity by substituting calcium (Ca), strontium (Sr), or barium (Ba), is added to metal oxide, the metal oxide includes the n-type conductivity in which the electron is the carrier. Incidentally, lanthanoid includes lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu).

A concentration of the element in the conductive layer 16 is, for example, equal to or greater than $1\times10^{18}$ cm$^{-3}$ and equal to or less than $1\times10^{21}$ cm$^{-3}$. The concentration of the element in the conductive layer 16, from a viewpoint of reducing electric resistance of the conductive layer 16, is desirably equal to or greater than $1\times10^{19}$ cm$^{-3}$, and is more desirably equal to or greater than $1\times10^{20}$ cm$^{-3}$.

It is possible to identify a type of the element, amount of the element, atomic ratio of the element contained in the conductive layer 16, by the SIMS.

The conductive layer 16 can be formed, for example, by a sputtering method at equal to or less than 400° C. In this state, the conductive layer 16 is of amorphous. After that, crystallization annealing (600° C. to 800° C.) can be performed. In addition, a polycrystalline film can be formed by growing the film to have good coverage, with a CVD method, and performing crystallization annealing. At that time, although the polycrystalline film can be columnar in the film thickness direction, if the polycrystalline film is made to be a laminated structure of two or more layers in which sizes of columns are varied, uniformity in a film plane of electrical properties of the film is increased. In particular, for the PTCR effect, it is important that a polycrystalline interface uniformly exists, and it is effective to make the laminated structure of the polycrystalline film of two or more layers in which the sizes of columns are varied. It is the same in the following embodiments.

Hereinafter, the function and effect are described of the semiconductor device of the present embodiment.

In the PIN diode of the present embodiment, same as the first embodiment, in the conductive layer 16, zirconium (Zr) or hafnium (Hf) is added to a metal oxide containing titanium. Thus, the work function of the metal oxide is reduced in comparison with a case in which the metal oxide does not contain zirconium (Zr) or hafnium (Hf). The effect of reducing the work function is achieved similarly even in a case in which calcium (Ca), strontium (Sr), or barium (Ba) is contained in the metal oxide. Therefore, the PIN diode is achieved of a low contact resistance between the cathode electrode 14 and the cathode region 18.

Figure 4:
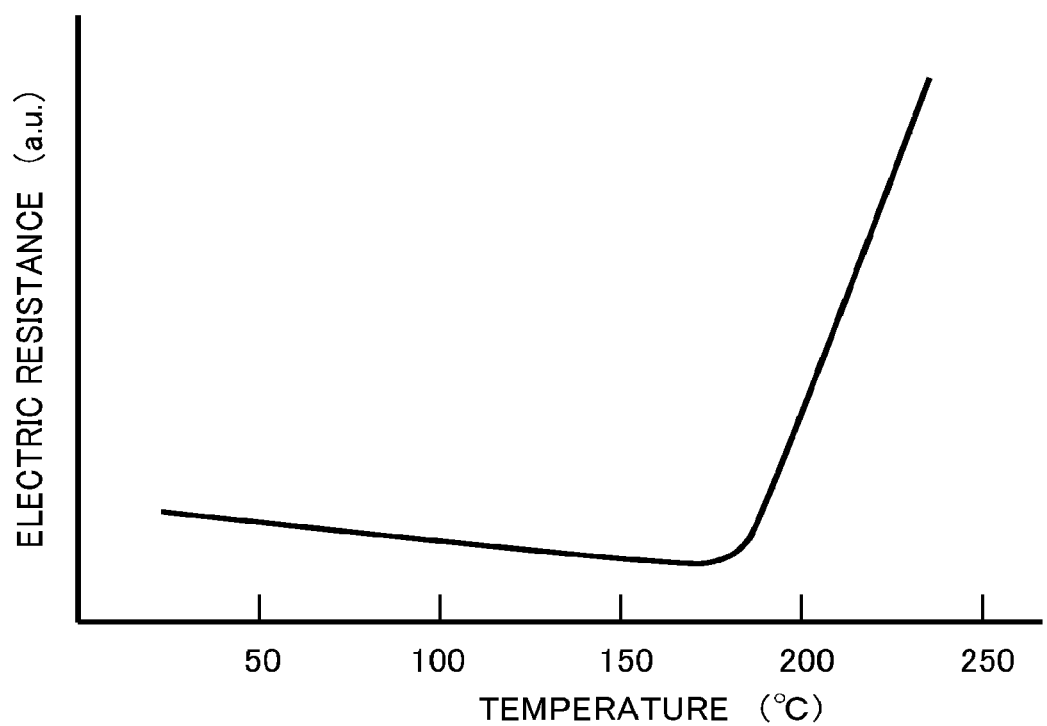
FIG. 4 is an explanatory diagram of a function and effect of a semiconductor device in a second embodiment.

FIG. 4 is a diagram for describing the function and effect of the semiconductor device of the present embodiment. FIG. 4 is a diagram illustrating temperature dependency of the electric resistance of the conductive layer 16 of the present embodiment.

The conductive layer 16 of the present embodiment is of, for example, calcium titanate, strontium titanate, or barium titanate. Calcium titanate, strontium titanate, barium titanate, and a composite thereof, as illustrated in FIG. 4, include a property in which the temperature dependency of the electric resistance turns from negative dependency to positive dependency. In other words, the conductive layer 16 of the present embodiment is of a resistor including a positive temperature coefficient (Positive Temperature Coefficient Resistor: PTCR) in a high temperature region.

For example, when excess current flows through the PIN diode, the PIN diode may be broken down by generation of heat due to the excess current. In the PIN diode of the present embodiment, the conductive layer 16 is of the PTCR. Therefore, if heat is generated when the excess current flows, the electric resistance of the conductive layer 16 is increased. Therefore, current flowing through the PIN diode is suppressed, and breakdown due to the excess current of the PIN diode is suppressed.

In an operation temperature region of the PIN diode, it is desirable that the electric resistance of the conductive layer 16 includes no temperature dependency or negative temperature dependency so that ON-state current of the PIN diode is not decreased. In addition, it is desirable that the temperature dependency of the electric resistance of the conductive layer 16 turns to the positive dependency before the PIN diode is broken down by temperature increase. From the viewpoints above, it is desirable that the temperature dependency of the electric resistance of the conductive layer 16 turns from the negative dependency to the positive dependency at a temperature equal to or greater than 150° C. and equal to or less than 200° C.

It is desirable that the conductive layer 16 contains lead (Pb). In calcium titanate, strontium titanate, barium titanate, and the composite thereof, by containing lead (Pb), it becomes possible to shift a region including the positive temperature coefficient to the high temperature side.

As described above, according to the present embodiment, the PIN diode is achieved of the low contact resistance between the cathode electrode 14 and the cathode region 18. In addition, the PIN diode is achieved of the low contact resistance with a relatively low temperature process. Further, due to the fact that the conductive layer 16 is of the PTCR, the breakdown due to the excess current of the PIN diode is suppressed.

Third Embodiment

A semiconductor device of the present embodiment is different from the semiconductor device of the first embodiment, in that the device is a MOSFET. Description is omitted of contents overlapping with those of the first embodiment, such as the configuration, function of the conductive layer.

Figure 5:
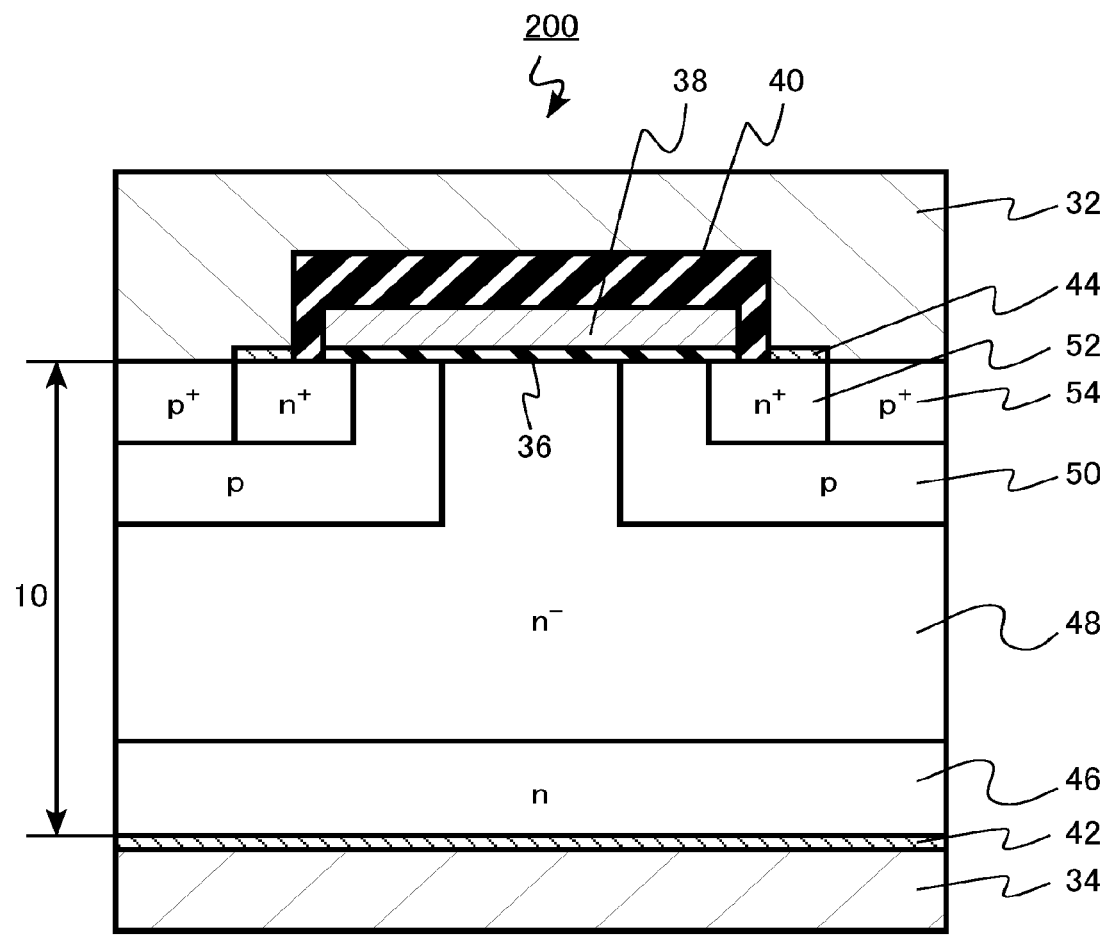
FIG. 5 is a schematic cross-sectional diagram illustrating a semiconductor device in a third embodiment.

FIG. 5 is a schematic cross-sectional diagram illustrating a configuration of the MOSFET being the semiconductor device of the present embodiment. A MOSFET (Metal Oxide Semiconductor Field Effect Transistor) 200 is, for example, a Double Implantation MOSFET (DIMOSFET), in which a well region and a source region are formed by ion implantation.

A MOSFET 200 includes an SiC layer 10, a source electrode (second metal layer) 32, a drain electrode (first metal layer) 34, a gate insulating film 36, a gate electrode 38, an interlayer insulating film 40, a first conductive layer 42, a second conductive layer 44. The SiC layer 10 includes a drain region (n-type first SiC region) 46, a drift region 48, a well region 50, a source region (n-type second SiC region) 52, a well contact region (p-type SiC region) 54.

The SiC layer 10 is of SiC whose crystal structure is 4H-SiC. The 4H-SiC is a hexagonal crystal system.

The SiC layer 10 has a first plane and a second plane. In FIG. 5, the first plane is an upper plane of the figure, and the second plane is a lower plane of the figure. Hereinafter, the first plane is referred to as a front plane, and the second plane is referred to as a back plane.

An example is described of a case in which the first plane is a plane inclined to a (0001) face by equal to or greater than 0 degrees and equal to or less than 8 degrees, and the second plane is a plane inclined to (000-1) face by equal to or greater than 0 degrees and equal to or less than 8 degrees. The (0001) face is referred to as a silicon face. The (000-1) face is referred to as a carbon face.

The drain region (n-type SiC region) 46 is of n-type SiC. The drain region 46 contains, for example, nitrogen (N) as an n-type impurity. A concentration of the n-type impurity of the drain region 46 is, for example, equal to or greater than $1 \times 10^{18}$ cm$^{-3}$ and equal to or less than $1 \times 10^{21}$ cm$^{-3}$.

From a viewpoint of reducing contact resistance between the drain electrode 34 and the drain region 46, a concentration of the n-type impurity in the second plane of the drain region 46 is desirably equal to or greater than $1 \times 10^{19}$ cm$^{-3}$, and is more desirably equal to or greater than $1 \times 10^{20}$ cm$^{-3}$.

The drift region 48 is provided on the drain region 46. The drift region 48 is of, for example, n$^-$-type SiC formed by epitaxial growth on the drain region 46. Thickness of the drift region 48 is, for example, equal to or greater than 5 μm and equal to or less than 150 μm.

The drift region 48 contains, for example, nitrogen (N) as an n-type impurity. A concentration of the n-type impurity of the drift region 48 is, for example, equal to or greater than $5 \times 10^{15}$ cm$^{-3}$ and equal to or less than $2 \times 10^{16}$ cm$^{-3}$.

The well region 50 is provided on the drift region 48. The well region 50 is of p-type SiC. The well region 50 functions as a channel region of the MOSFET 200. The well region 50 contains, for example, aluminum (Al) as a p-type impurity. A concentration of the p-type impurity of the well region 50 is equal to or greater than $5 \times 10^{15}$ cm$^{-3}$ and equal to or less than $1 \times 10^{17}$ cm$^{-3}$. Depth of the well region 50 is, for example, equal to or greater than 0.4 μm and equal to or less than 0.8 μm.

The source region 52 is provided in the well region 50. The source region 52 is of n$^+$-type SiC. The source region 52 contains, for example, nitrogen (N) as an n-type impurity. A concentration of the n-type impurity of the source region 52 is, for example, equal to or greater than $1 \times 10^{18}$ cm$^{-3}$ and equal to or less than $1 \times 10^{21}$ cm$^{-3}$.

From a viewpoint of reducing contact resistance between the source electrode 32 and the source region 52, a concentration of the n-type impurity in the first plane of the source region 52 is desirably equal to or greater than $1 \times 10^{19}$ cm$^{-3}$, and is more desirably equal to or greater than $1 \times 10^{20}$ cm$^{-3}$.

Depth of the source region 52 is shallower than depth of the well region 50, and is, for example, equal to or greater than 0.2 μm and equal to or less than 0.4 μm.

The well contact region 54 is provided in the well region 50. The well contact region 54 is provided laterally to the source region 52.

The well contact region 54 is of p$^-$-type SiC. The well contact region 54 contains, for example, aluminum (Al) as a p-type impurity. A concentration of the p-type impurity of the well contact region 54 is, for example, equal to or greater than $1 \times 10^{18}$ cm$^{-3}$ and equal to or less than $1 \times 10^{21}$ cm$^{-3}$.

Depth of the well contact region 54 is shallower than depth of the well region 50, and is, for example, equal to or greater than 0.2 μm and equal to or less than 0.4 μm.

The gate insulating film 36 is formed on the front planes of the drift region 48 and the well region 50. For the gate insulating film 36, for example, a silicon oxide film and a high-k insulating film can be applied.

The gate electrode 38 is provided on the gate insulating film 36. For the gate electrode 38, for example, polycrystalline silicon doped with an impurity can be applied.

The interlayer insulating film 40 is provided on the gate electrode 38. The interlayer insulating film 40 is of, for example, a silicon oxide film.

The well region 50 sandwiched between the source region 52 and the drift region 48 below the gate electrode 38, functions as the channel region of the MOSFET 200.

The source electrode 32 is provided on the front plane of the SiC layer 10. The source electrode 32 is electrically connected with the source region 52 and the well contact region 54. The source electrode 32 is in contact with the well contact region 54 and the second conductive layer 44. The source electrode 32 also includes a function of applying electrical potential to the well region 50.

The source electrode 32 is of metal. The metal forming the source electrode 32 is of, for example, a laminated structure of titanium (Ti) and aluminum (Al). The metal forming the source electrode 32 may react with the SiC layer 10 to form metal silicide or metal carbide.

The drain electrode 34 is provided on the back plane of the SiC layer 10. The drain electrode 34 is electrically connected with the drain region 46.

The drain electrode 34 is of metal. The metal forming the drain electrode 34 is, for example, titanium nitride (TiN).

The first conductive layer 42 is provided between the drain region (n-type first SiC region) 46 and the drain electrode (first metal layer) 34. The first conductive layer 42 is in contact with the drain region 46. The first conductive layer 42 is in contact with the drain electrode 34.

The second conductive layer 44 is provided between the source region (n-type second SiC region) 52 and the source electrode (second metal layer) 32. The second conductive layer 44 is in contact with the source region 52. The second conductive layer 44 is in contact with the source electrode 32.

The first conductive layer 42 and the second conductive layer 44 contain titanium (Ti), oxygen (O), zirconium (Zr) or hafnium (Hf), and at least one element selected from the group consisting of vanadium (V), niobium (Nb), and tantalum (Ta).

As described above, according to the present embodiment, the MOSFET 200 is achieved of a low contact resistance between the drain electrode 34 and the drain region 46. In addition, the MOSFET 200 is achieved of a low contact resistance between the source electrode 32 and the source region 52. In addition, the MOSFET 200 is achieved of the low contact resistance with a relatively low temperature process.

Further, to the n$^+$-type source region 52 and the p$^+$-type well contact region 54, contact can be achieved of a low contact resistance by the source electrode 32 simultaneously. Since contact between the second conductive layer 44 and the source electrode 32 becomes contact between metal and metal, it is possible to select a metal material forming the source electrode 32 without considering the contact resistance. Therefore, as the metal material of the source electrode 32, a metal material can be selected of reducing the contact resistance to the well contact region 54.

Fourth Embodiment

A semiconductor device of the present embodiment is the same as the semiconductor device of the third embodiment, except that first and second conductive layers contain at least one metal element selected from the group consisting of calcium (Ca), strontium (Sr), and barium (Ba), and that elements are different from those that can be contained in the first and second conductive layers. Therefore, description is omitted of contents overlapping with those of the third embodiment. In addition, for the configuration, function, and the like of the conductive layer, description is omitted of contents overlapping with those of the first or second embodiment.

The semiconductor device of the present embodiment is a MOSFET. The MOSFET of the present embodiment is described with reference to FIG. 5.

A first conductive layer 42 and a second conductive layer 44 contain at least one metal element selected from the group consisting of calcium (Ca), strontium (Sr), and barium (Ba). In addition, the first conductive layer 42 and the second conductive layer 44 contain titanium (Ti) and oxygen (O). In addition, the first conductive layer 42 and second conductive layer 44 contain zirconium (Zr) or hafnium (Hf). In addition, the first conductive layer 42 and the second conductive layer 44 contain at least one element selected from the group consisting of vanadium (V), niobium (Nb), tantalum (Ta), scandium (Sc), yttrium (Y), and lanthanoid.

The first conductive layer 42 and the second conductive layer 44 are of metal oxide. The first conductive layer 42 and the second conductive layer 44 are of, for example, calcium titanate, strontium titanate, barium titanate, or a composite thereof. The first conductive layer 42 and the second conductive layer 44 are of, for example, $(Ca,Sr,Ba)(Ti,Zr,Hf)O_3$ including perovskite structure. The first conductive layer 42 and the second conductive layer 44 are of polycrystal or amorphous.

The first conductive layer 42 and the second conductive layer 44 are of the PTCR.

As described above, according to the present embodiment, the MOSFET is achieved of a low contact resistance between a drain electrode 34 and a drain region 46. In addition, the MOSFET is achieved of a low contact resistance between a source electrode 32 and a source region 52. In addition, the MOSFET is achieved of the low contact resistance with a relatively low temperature process.

Further, to the $n^-$-type source region 52 and a $p^+$-type well contact region 54, contact can be achieved of a low contact resistance by the source electrode 32 simultaneously. Further, due to the fact that the first conductive layer 42 and the second conductive layer 44 are of the PTCR, breakdown due to excess current of the MOSFET is suppressed.

Fifth Embodiment

A semiconductor device of the present embodiment is different from the semiconductor device of the third embodiment, in that the device is a MOSFET of a trench gate structure. Description is omitted of contents overlapping with those of the third embodiment.

Figure 6:
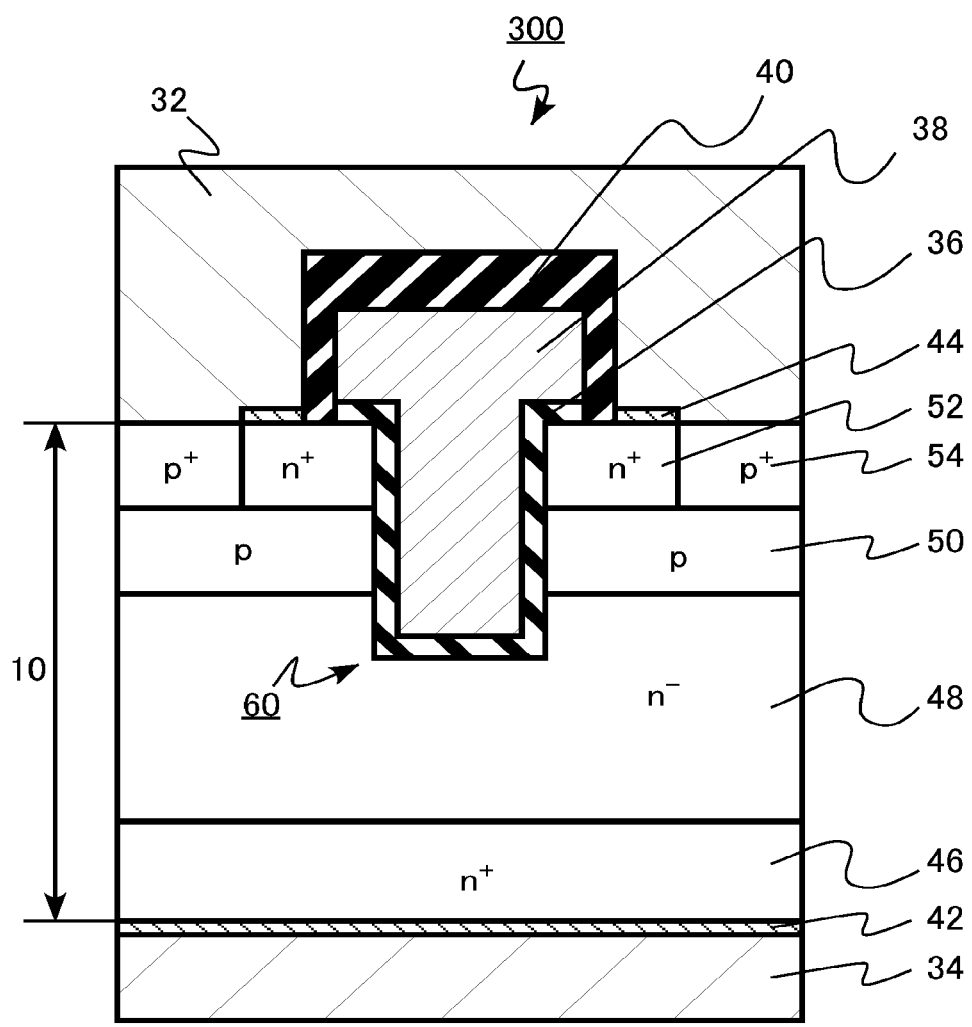
FIG. 6 is a schematic cross-sectional diagram illustrating a semiconductor device in a fifth embodiment.

FIG. 6 is a schematic cross-sectional diagram illustrating a configuration of the MOSFET being the semiconductor device of the present embodiment. A MOSFET 300 is the MOSFET of the trench gate structure in which a gate electrode is provided in the trench.

The MOSFET 300 includes an SiC layer 10, a source electrode (second metal layer) 32, a drain electrode (first metal layer) 34, a gate insulating film 36, a gate electrode 38, an interlayer insulating film 40, a first conductive layer 42, a second conductive layer 44. The SiC layer 10 includes a drain region (n-type first SiC region) 46, adrift region 48, a well region 50, a source region (n-type second SiC region) 52, a well contact region (p-type SiC region) 54.

The gate insulating film 36 and the gate electrode 38 are formed in a trench 60 provided in the SiC layer 10.

The first conductive layer 42 and the second conductive layer 44 contain titanium (Ti), oxygen (O), zirconium (Zr) or hafnium (Hf), and at least one element selected from the group consisting of vanadium (V), niobium (Nb), and tantalum (Ta).

According to the present embodiment, same as the third embodiment, the MOSFET 300 is achieved of a low contact resistance between the drain electrode 34 and the drain region 46. In addition, same as the third embodiment, the MOSFET 300 is achieved of a low contact resistance between the source electrode 32 and the source region 52. In addition, same as the third embodiment, the MOSFET 300 is achieved of the low contact resistance with a relatively low temperature process.

Further, same as the third embodiment, to the $n^+$-type source region 52 and the $p^+$-type well contact region 54, contact can be achieved of a low contact resistance by the source electrode 32 simultaneously.

Further, by the trench gate structure, the MOSFET 300 is achieved of a large ON-state current.

Sixth Embodiment

A semiconductor device of the present embodiment is the same as the semiconductor of the fifth embodiment, except that first and second conductive layers contain at least one metal element selected from the group consisting of calcium (Ca), strontium (Sr), and barium (Ba), and that elements are different from those that can be contained in the first and second conductive layers. Therefore, description is omitted of contents overlapping with those of the fifth embodiment. In addition, for the configuration, function, and the like of the conductive layer, description is omitted of contents overlapping with those of the first or second embodiment.

The semiconductor device of the present embodiment is a MOSFET. The MOSFET of the present embodiment is described with reference to FIG. 6.

A first conductive layer 42 and a second conductive layer 44 contain at least one metal element selected from the group consisting of calcium (Ca), strontium (Sr), and barium (Ba). In addition, the first conductive layer 42 and the second conductive layer 44 contain titanium (Ti) and oxygen (O). In addition, the first conductive layer 42 and second conductive layer 44 contain zirconium (Zr) or hafnium (Hf). In addition, the first conductive layer 42 and the second conductive layer 44 contain at least one element selected from the group consisting of vanadium (V), niobium (Nb), tantalum (Ta), scandium (Sc), yttrium (Y), and lanthanoid.

The first conductive layer 42 and the second conductive layer 44 are of metal oxide. The first conductive layer 42 and the second conductive layer 44 are of, for example, calcium titanate, strontium titanate, barium titanate, or a composite thereof. The first conductive layer 42 and the second conductive layer 44 are of, for example, $(Ca,Sr,Ba)(Ti,Zr,Hf)O_3$ including perovskite structure. The first conductive layer 42 and the second conductive layer 44 are of polycrystal or amorphous.

The first conductive layer 42 and the second conductive layer 44 are of the PTCR.

It is desirable that the first conductive layer 42 and the second conductive layer 44 contain lead (Pb). In calcium titanate, strontium titanate, barium titanate, and the composite thereof, by containing lead (Pb), it becomes possible to shift a region including the positive temperature coefficient to the high temperature side.

As described above, according to the present embodiment, same as the fifth embodiment, the MOSFET is achieved of a low contact resistance between a drain electrode 34 and a drain region 46. In addition, same as the fifth embodiment, the MOSFET is achieved of a low contact resistance between a source electrode 32 and a source region 52. In addition, same as the fifth embodiment, the MOSFET is achieved of the low contact resistance with a relatively low temperature process.

Further, same as the fifth embodiment, to the $n^+$-type source region 52 and a $p^+$-type well contact region 54, contact can be achieved of a low contact resistance by the source electrode 32 simultaneously. Further, same as the fifth embodiment, by the trench gate structure, the MOSFET is achieved of a large ON-state current.

Further, due to the fact that the first conductive layer 42 and the second conductive layer 44 are of the PTCR, breakdown due to excess current of the MOSFET is suppressed. In particular, since the MOSFET of the present embodiment is of the trench gate structure, the ON-state current is large. Therefore, prevention effect of the breakdown due to the excess current of the MOSFET is particularly useful.

Seventh Embodiment

A semiconductor device of the present embodiment is different from the semiconductor device of the third embodiment, in that the device is a MOSFET of a super junction structure. Description is omitted of contents overlapping with those of the third embodiment.

Figure 7:
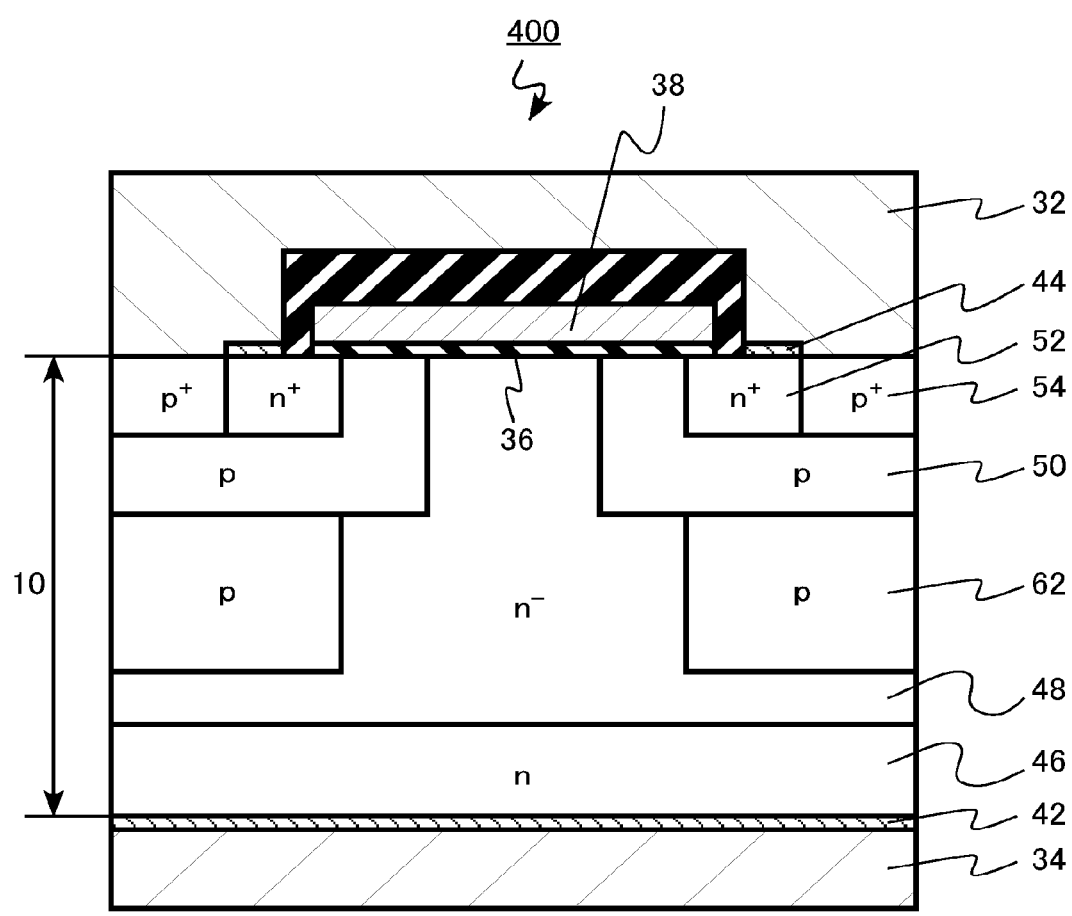
FIG. 7 is a schematic cross-sectional diagram illustrating a semiconductor device in a seventh embodiment.

FIG. 7 is a schematic cross-sectional diagram illustrating a configuration of the MOSFET being the semiconductor device of the present embodiment. A MOSFET 400 is the MOSFET of the super junction structure in which a p-type pillar region is provided in the drift region.

The MOSFET 400 includes an SiC layer 10, a source electrode (second metal layer) 32, a drain electrode (first metal layer) 34, a gate insulating film 36, a gate electrode 38, an interlayer insulating film 40, a first conductive layer 42, a second conductive layer 44. The SiC layer 10 includes a drain region (n-type first SiC region) 46, a drift region 48, a well region 50, a source region (n-type second SiC region) 52, a well contact region (p-type SiC region) 54, a pillar region 62.

The pillar region 62 is provided in the drift region 48. The pillar region 62 is of p-type SiC.

The pillar region 62 contains, for example, aluminum (Al) as a p-type impurity. A concentration of the p-type impurity of the pillar region 62 is, for example, equal to or greater than $5 \times 10^{15}$ cm$^{-3}$ and equal to or less than $1 \times 10^{18}$ cm$^{-3}$.

In the SiC layer 10, the $n^-$-type drift region 48 and the p-type pillar region 62 are arranged alternately in the lateral direction to form the super junction structure. By forming the super junction structure, an electric field is relaxed in an OFF state of the MOSFET 400, and dielectric breakdown voltage is improved of the MOSFET 400.

The first conductive layer 42 and the second conductive layer 44 contain titanium (Ti), oxygen (O), zirconium (Zr) or hafnium (Hf), and at least one element selected from the group consisting of vanadium (V), niobium (Nb), and tantalum (Ta).

According to the present embodiment, same as the third embodiment, the MOSFET 400 is achieved of a low contact resistance between the drain electrode 34 and the drain region 46. In addition, same as the third embodiment, the MOSFET 400 is achieved of a low contact resistance between the source electrode 32 and the source region 52. In addition, same as the third embodiment, the MOSFET 400 is achieved of the low contact resistance with a relatively low temperature process.

Further, same as the third embodiment, to the $n^+$-type source region 52 and the $p^+$-type well contact region 54, contact can be achieved of a low contact resistance by the source electrode 32 simultaneously.

Further, by the super junction structure, the MOSFET 400 is achieved of improving the dielectric breakdown voltage.

Eighth Embodiment

A semiconductor device of the present embodiment is the same as the semiconductor device of the seventh embodiment, except that first and second conductive layers contain at least one metal element selected from the group consisting of calcium (Ca), strontium (Sr), and barium (Ba), and that elements are different from those that can be contained in the first and second conductive layers. Therefore, description is omitted of contents overlapping with those of the seventh embodiment. In addition, for the configuration, function, and the like of the conductive layer, description is omitted of contents overlapping with those of the first or second embodiment.

The semiconductor device of the present embodiment is a MOSFET. The MOSFET of the present embodiment is described with reference to FIG. 7.

A first conductive layer 42 and a second conductive layer 44 contain at least one metal element selected from the group consisting of calcium (Ca), strontium (Sr), and barium (Ba). In addition, the first conductive layer 42 and the second conductive layer 44 contain titanium (Ti) and oxygen (O). In addition, the first conductive layer 42 and second conductive layer 44 contain zirconium (Zr) or hafnium (Hf). In addition, the first conductive layer 42 and the second conductive layer 44 contain at least one element selected from the group consisting of vanadium (V), niobium (Nb), tantalum (Ta), scandium (Sc), yttrium (Y), and lanthanoid.

The first conductive layer 42 and the second conductive layer 44 are of metal oxide. The first conductive layer 42 and the second conductive layer 44 are of, for example, calcium titanate, strontium titanate, barium titanate, or a composite thereof. The first conductive layer 42 and the second conductive layer 44 are of, for example, (Ca,Sr,Ba)(Ti,Zr,Hf)O$_3$ including perovskite structure. The first conductive layer 42 and the second conductive layer 44 are of polycrystal or amorphous.

The first conductive layer 42 and the second conductive layer 44 are of the PTCR.

It is desirable that the first conductive layer 42 and the second conductive layer 44 contain lead (Pb). In calcium titanate, strontium titanate, barium titanate, and the composite thereof, by containing lead (Pb), it becomes possible to shift a region including the positive temperature coefficient to the high temperature side.

As described above, according to the present embodiment, the MOSFET is achieved of a low contact resistance between a drain electrode 34 and a drain region 46. In addition, the MOSFET is achieved of a low contact resistance between a source electrode 32 and a source region 52. In addition, the MOSFET is achieved of the low contact resistance with a relatively low temperature process.

Further, to the n$^+$-type source region 52 and a p$^+$-type well contact region 54, contact can be achieved of a low contact resistance by the source electrode 32 simultaneously. Further, due to the fact that the first conductive layer 42 and the second conductive layer 44 are of the PTCR, breakdown due to excess current of the MOSFET is suppressed. Further, by the super junction structure, the MOSFET is achieved of improving dielectric breakdown voltage.

Ninth Embodiment

A semiconductor device of the present embodiment is different from the semiconductor device of the fifth embodiment, in that the device is a MOSFET of a super junction structure. Description is omitted of contents overlapping with the fifth embodiment.

Figure 8:
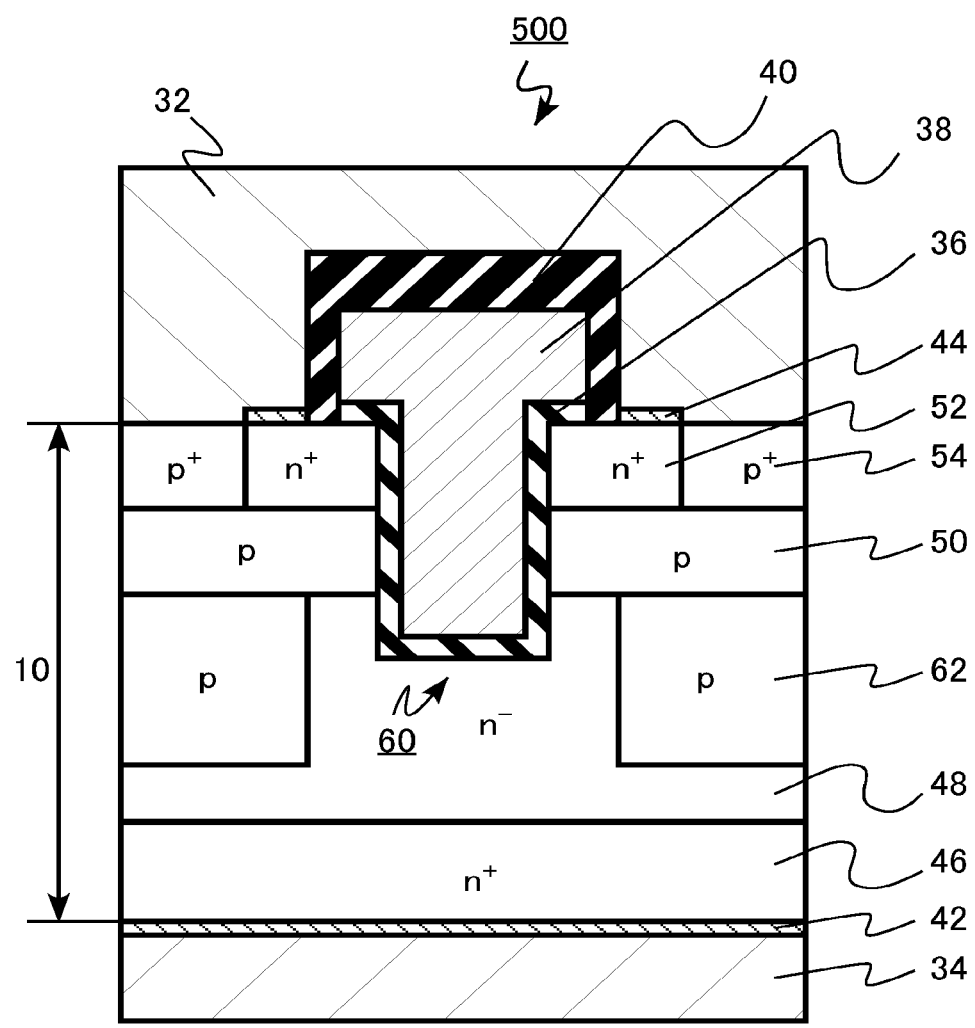
FIG. 8 is a schematic cross-sectional diagram illustrating a semiconductor device in a ninth embodiment.

FIG. 8 is a schematic cross-sectional diagram illustrating a configuration of the MOSFET being the semiconductor device of the present embodiment. A MOSFET 500 is a MOSFET of a trench gate structure in which a gate electrode is provided in the trench. In addition, the MOSFET 500 is a MOSFET of the super junction structure in which a p-type pillar region is provided in the drift region.

The MOSFET 500 includes an SiC layer 10, a source electrode (second metal layer) 32, a drain electrode (first metal layer) 34, a gate insulating film 36, a gate electrode 38, an interlayer insulating film 40, a first conductive layer 42, a second conductive layer 44. The SiC layer 10 includes a drain region (n-type first SiC region) 46, a drift region 48, a well region 50, a source region (n-type second SiC region) 52, a well contact region (p-type SiC region) 54, a pillar region 62.

The gate insulating film 36 and the gate electrode 38 are formed in a trench 60 provided in the SiC layer 10.

The pillar region 62 is provided in the drift region 48. The pillar region 62 is of p-type SiC.

The pillar region 62 contains, for example, aluminum (Al) as a p-type impurity. A concentration of the p-type impurity of the pillar region 62 is, for example, equal to or greater than $5 \times 10^{15}$ cm$^{-3}$ and equal to or less than $1 \times 10^{18}$ cm$^{-3}$.

In the SiC layer 10, the n$^-$-type drift region 48 and the p-type pillar region 62 are arranged alternately in the lateral direction to form the super junction structure. By forming the super junction structure, an electric field is relaxed in an OFF state of the MOSFET 500, and dielectric breakdown voltage is improved of the MOSFET 500.

The first conductive layer 42 and the second conductive layer 44 contain titanium (Ti), oxygen (O), zirconium (Zr) or hafnium (Hf), and at least one element selected from the group consisting of vanadium (V), niobium (Nb), and tantalum (Ta).

According to the present embodiment, same as the fifth embodiment, the MOSFET 500 is achieved of a low contact resistance between the drain electrode 34 and the drain region 46. In addition, same as the fifth embodiment, the MOSFET 500 is achieved of a low contact resistance between the source electrode 32 and the source region 52. In addition, same as the fifth embodiment, the MOSFET 500 is achieved of the low contact resistance with a relatively low temperature process.

Further, same as the fifth embodiment, to the n$^+$-type source region 52 and the p$^+$-type well contact region 54, contact can be achieved of a low contact resistance by the source electrode 32 simultaneously. Further, by the trench gate structure, the MOSFET 500 is achieved of a large ON-state current.

Further, by the super junction structure, the MOSFET 500 is achieved of improving the dielectric breakdown voltage.

Tenth Embodiment

A semiconductor device of the present embodiment is the same as the semiconductor device of the ninth embodiment, except that first and second conductive layers contain at least one metal element selected from the group consisting of calcium (Ca), strontium (Sr), and barium (Ba), and that elements are different from those that can be contained in the first and second conductive layers. Therefore, description is omitted of contents overlapping with those of the ninth embodiment. In addition, for the configuration, function, and the like of the conductive layer, description is omitted of contents overlapping with those of the first or second embodiment.

The semiconductor device of the present embodiment is a MOSFET. The MOSFET of the present embodiment is described with reference to FIG. 8.

A first conductive layer 42 and a second conductive layer 44 contain at least one metal element selected from the group consisting of calcium (Ca), strontium (Sr), and barium (Ba). In addition, the first conductive layer 42 and the second conductive layer 44 contain titanium (Ti) and oxygen (O). In addition, the first conductive layer 42 and the second conductive layer 44 contain zirconium (Zr) or hafnium (Hf). In addition, the first conductive layer 42 and the second conductive layer 44 contain at least one element selected from the group consisting of vanadium (V), niobium (Nb), tantalum (Ta), scandium (Sc), yttrium (Y), and lanthanoid.

The first conductive layer 42 and the second conductive layer 44 are of metal oxide. The first conductive layer 42 and the second conductive layer 44 are of, for example, calcium titanate, strontium titanate, barium titanate, or a composite thereof. The first conductive layer 42 and the second conductive layer 44 are of, for example, (Ca,Sr,Ba)(Ti,Zr,Hf)O$_3$ including perovskite structure. The first conductive layer 42 and the second conductive layer 44 are of polycrystal or amorphous.

The first conductive layer 42 and the second conductive layer 44 are of the PTCR.

It is desirable that the first conductive layer 42 and the second conductive layer 44 contain lead (Pb). In calcium titanate, strontium titanate, barium titanate, and the composite thereof, by containing lead (Pb), it becomes possible to shift a region including the positive temperature coefficient to the high temperature side.

As described above, according to the present embodiment, same as the ninth embodiment, the MOSFET is achieved of a low contact resistance between a drain electrode 34 and a drain region 46. In addition, same as the ninth embodiment, the MOSFET is achieved of a low contact resistance between a source electrode 32 and a source region 52. In addition, same as the ninth embodiment, the MOSFET is achieved of the low contact resistance with a relatively low temperature process.

Further, same as the ninth embodiment, to the n$^+$-type source region 52 and a p$^+$-type well contact region 54, contact can be achieved of a low contact resistance by the source electrode 32 simultaneously. Further, same as the ninth embodiment, by the trench gate structure, the MOSFET is achieved of a large ON-state current. Further, same as the ninth embodiment, by the super junction structure, the MOSFET is achieved of improving dielectric breakdown voltage.

Further, due to the fact that the first conductive layer 42 and the second conductive layer 44 are of the PTCR, breakdown due to excess current of the MOSFET is suppressed. In particular, since the MOSFET of the present embodiment is of the trench gate structure, the ON-state current is large. Therefore, prevention effect of the breakdown due to the excess current of the MOSFET is particularly useful.

Eleventh Embodiment

A semiconductor device of the present embodiment is different from the semiconductor device of the third embodiment, in that the device is an IGBT (Insulated Gate Bipolar Transistor). Description is omitted of contents overlapping with those of the third embodiment.

Figure 9:
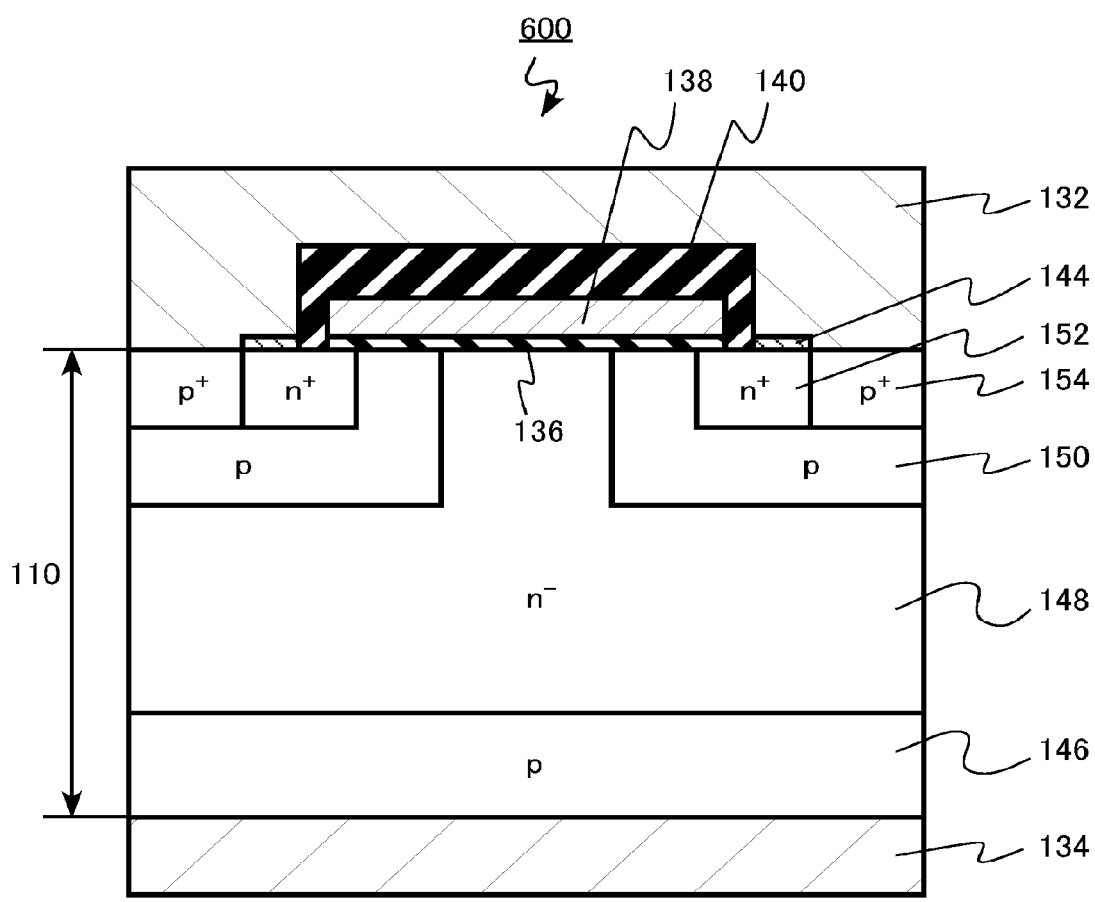
FIG. 9 is a schematic cross-sectional diagram illustrating a semiconductor device in an eleventh embodiment.

FIG. 9 is a schematic cross-sectional diagram illustrating a configuration of an IGBT being a semiconductor device of the present embodiment.

An IGBT 600 includes an SiC layer 110, an emitter electrode (metal layer) 132, a collector electrode 134, a gate insulating film 136, a gate electrode 138, an interlayer insulating film 140, a conductive layer 144. The SiC layer 110 includes a collector region 146, a drift region 148, a base region 150, an emitter region (n-type SiC region) 152, a base contact region (p-type SiC region) 154.

The SiC layer 110 is SiC whose crystal structure is 4H-SiC. The 4H-SiC is a hexagonal crystal system.

The SiC layer 110 has a first plane and a second plane. In FIG. 9, the first plane is an upper plane of the figure, and the second plane is a lower plane of the figure. Hereinafter, the first plane is referred to as a front plane, and the second plane is referred to as a back plane.

Hereinafter, a case is described as an example in which the first plane is a plane inclined to a (0001) face by equal to or greater than 0 degrees and equal to or less than 8 degrees, and the second plane is a plane inclined to a (000-1) face by equal to or greater than 0 degrees and equal to or less than 8 degrees. The (0001) face is referred to as a silicon face. The (000-1) face is referred to as a carbon face.

The collector region 146 is of p-type SiC. The collector region 146 contains, for example, aluminum (Al) as a p-type impurity. A concentration of the p-type impurity of the collector region 146 is equal to or greater than $1\times10^{18}$ cm$^{-3}$ and equal to or less than $1\times10^{21}$ cm$^{-3}$.

From a viewpoint of reducing contact resistance between the collector electrode 134 and the collector region 146, a concentration of the p-type impurity in the second plane of the collector region 146 is desirably equal to or greater than $1\times10^{19}$ cm$^{-3}$, and is more desirably equal to or greater than $1\times10^{20}$ cm$^{-3}$.

The drift region 148 is provided on the collector region 146. The drift region 148 is of, for example, n$^-$-type SiC formed by epitaxial growth on the collector region 146. Thickness of the drift region 148 is, for example, equal to or greater than 5 μm and equal to or less than 150 μm.

The drift region 148 contains, for example, nitrogen (N) as an n-type impurity. A concentration of the n-type impurity of the drift region 148 is equal to or greater than $5\times10^{10}$ cm$^{-3}$ and equal to or less than $2\times10^{16}$ cm$^{-3}$.

The base region 150 is provided on the drift region 148. The base region 150 is of p-type SiC. The base region 150 functions as a channel region of the IGBT 600.

The base region 150 contains, for example, aluminum (Al) as a p-type impurity. A concentration of the p-type impurity of the base region 150 is equal to or greater than $5\times10^{15}$ cm$^{-3}$ and equal to or less than $1\times10^{17}$ cm$^{-3}$. Depth of the base region 150 is, for example, equal to or greater than 0.4 μm and equal to or less than 0.8 μm.

The emitter region 152 is provided in the base region 150. The emitter region 152 is of n$^+$-type SiC. The emitter region 152 contains, for example, nitrogen (N) as an n-type impurity. A concentration of the n-type impurity of the emitter region 152 is equal to or greater than $1\times10^{18}$ cm$^{-3}$ and equal to or less than $1\times10^{21}$ cm$^{-3}$.

From a viewpoint of reducing contact resistance between the emitter electrode (metal layer) 132 and the emitter region 152, a concentration of the n-type impurity in the first plane of the emitter region 152 is desirably equal to or greater than $1\times10^{19}$ cm$^{-3}$, and is more desirably equal to or greater than $1\times10^{20}$ cm$^{-3}$.

Depth of the emitter region 152 is shallower than depth of the base region 150, and is, for example, equal to or greater than 0.2 μm and equal to or less than 0.4 μm.

The base contact region 154 is provided in the base region 150. The base contact region 154 is provided laterally to the emitter region 152.

The base contact region 154 is of p$^+$-type SiC. The base contact region 154 contains, for example, aluminum (Al) as a p-type impurity. A concentration of the p-type impurity of the base contact region 154 is, for example, equal to or greater than $1\times10^{18}$ cm$^{-3}$ and equal to or less than $1\times10^{21}$ cm$^{-3}$.

Depth of the base contact region 154 is shallower than depth of the base region 150, and is, for example, equal to or greater than 0.2 μm and equal to or less than 0.4 μm.

The gate insulating film 136 is formed on the front planes of the drift region 148 and the base region 150. For the gate insulating film 136, for example, a silicon oxide film and a high-k insulating film can be applied.

The gate electrode 138 is provided on the gate insulating film 136. For the gate electrode 138, for example, polycrystalline silicon doped with an impurity can be applied.

The interlayer insulating film 140 is provided on the gate electrode 138. The interlayer insulating film 140 is of, for example, a silicon oxide film.

The base region 150 sandwiched between the emitter region 152 and the drift region 148 below the gate electrode 138, functions as the channel region of the IGBT 600.

The emitter electrode 132 is provided on the front plane of the SiC layer 110. The emitter electrode 132 is electrically connected with the emitter region 152 and the base contact region 154. The emitter electrode 132 is in contact with the base contact region 154 and the conductive layer 144. The emitter electrode 132 also includes a function of applying electrical potential to the base region 150.

The emitter electrode (metal layer) 132 is of metal. The metal forming the emitter electrode 132 is of, for example, a laminated structure of titanium (Ti) and aluminum (Al). The metal forming the emitter electrode 132 may react with the SiC layer 110 to form metal silicide or metal carbide.

The collector electrode 134 is provided on the back plane of the SiC layer 110. The collector electrode 134 is electrically connected with the collector region 146.

The collector electrode 134 is of metal. The metal forming the collector electrode 134 is, for example, titanium nitride (TiN).

The conductive layer 144 is provided between the emitter region (n-type SiC region) 152 and the emitter electrode (metal layer) 132. The conductive layer 144 is in contact with the emitter region 152. The conductive layer 144 is in contact with emitter electrode 132.

The conductive layer 144 contains titanium (Ti), oxygen (O), zirconium (Zr) or hafnium (Hf), and at least one element selected from the group consisting of vanadium (V), niobium (Nb), and tantalum (Ta).

As described above, according to the present embodiment, the IGBT 600 is achieved of a low contact resistance between the emitter electrode 132 and the emitter region 152. In addition, the IGBT 600 is achieved of the low contact resistance with a relatively low temperature process.

Further, to the n$^+$-type emitter region 152 and the p$^+$-type base contact region 154, contact can be achieved of a low contact resistance by the emitter electrode 132 simultaneously. Since contact between the conductive layer 144 and the emitter electrode 132 becomes contact between metal and metal, it is possible to select a metal material forming the emitter electrode 132 without considering the contact resistance. Therefore, as the metal material of the emitter electrode 132, a metal material can be selected of reducing the contact resistance to the base contact region 154.

Twelfth Embodiment

A semiconductor device of the present embodiment is the same as the semiconductor device of the eleventh embodiment, except that the conductive layer contains at least one metal element selected from the group consisting of calcium (Ca), strontium (Sr), and barium (Ba), and that elements are different from those that can be contained in the conductive layer. Therefore, description is omitted of contents overlapping with those of the eleventh embodiment. In addition, for the configuration, function, and the like of the conductive layer, description is omitted of contents overlapping with those of the first or second embodiment.

The semiconductor device of the present embodiment is an IGBT. The IGBT of the present embodiment is described with reference to FIG. 9.

A conductive layer 144 contains at least one metal element selected from the group consisting of calcium (Ca), strontium (Sr), and barium (Ba). In addition, the conductive layer 144 contains titanium (Ti) and oxygen (O). In addition, the conductive layer 144 contains zirconium (Zr) or hafnium (Hf). In addition, the conductive layer 144 contains at least one element selected from the group consisting of vanadium (V), niobium (Nb), tantalum (Ta), scandium (Sc), yttrium (Y), and lanthanoid.

The conductive layer 144 is of metal oxide. The conductive layer 144 is of, for example, calcium titanate, strontium titanate, barium titanate, or a composite thereof. The conductive layer 144 is of, for example, (Ca,Sr,Ba)(Ti,Zr,Hf)O$_3$ including perovskite structure. The conductive layer 144 is polycrystal or amorphous.

The conductive layer 144 is of the PTCR.

It is desirable that the conductive layer 144 contains lead (Pb). In calcium titanate, strontium titanate, barium titanate, and the composite thereof, by containing lead (Pb), it becomes possible to shift a region including the positive temperature coefficient to the high temperature side.

As described above, according to the present embodiment, same as the eleventh embodiment, the IGBT is achieved of a low contact resistance between an emitter electrode 132 and an emitter region 152. In addition, same as the eleventh embodiment, the IGBT is achieved of the low contact resistance with a relatively low temperature process.

Further, same as the eleventh embodiment, to the n$^+$-type emitter region 152 and a p$^+$-type base contact region 154, contact can be achieved of a low contact resistance by the emitter electrode 132 simultaneously.

Further, due to the fact that the conductive layer 144 is of the PTCR, breakdown due to excess current of the IGBT is suppressed.

In the first through twelfth embodiments, although nitrogen (N) has been exemplified as an n-type impurity, it is possible to apply phosphorus (P), arsenic (As), antimony (Sb), and the like, instead of nitrogen (N). In addition, although aluminum (Al) has been exemplified as a p-type impurity, it is possible to apply boron (B), gallium (Ga), indium (In), and the like, instead of aluminum (Al).

While certain embodiments have been described, these embodiments have been presented by way of example only, and are not intended to limit the scope of the inventions. Indeed, semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   an n-type SiC region;
   a metal layer; and
   a conductive layer provided between the n-type SiC region and the metal layer, the conductive layer including titanium (Ti), oxygen (O), at least one first element from zirconium (Zr) and hafnium (Hf), and at least one second element from vanadium (V), niobium (Nb), and tantalum (Ta).

2. The device according to claim 1, wherein an atomic ratio of titanium to sum of titanium, zirconium, and hafnium in the conductive layer (Ti/(Ti+Zr+Hf)) is equal to or greater than 0.5 and equal to or less than 0.8.

3. The device according to claim 1, wherein a concentration of the at least one second element in the conductive layer is equal to or greater than $1 \times 10^{19}$ cm$^{-3}$.

4. The device according to claim 1, wherein the conductive layer contains metal oxide.

5. The device according to claim 1, wherein a concentration of an n-type impurity of the n-type SiC region is equal to or greater than $1 \times 10^{19}$ cm$^{-3}$.

6. The device according to claim 1, further comprising a p-type SiC region, wherein the metal layer is in contact with the p-type SiC region and the conductive layer.

7. A semiconductor device comprising:
   an n-type SiC region;
   a metal layer; and
   a conductive layer provided between the n-type SiC region and the metal layer, the conductive layer including titanium (Ti), oxygen (O), at least one first element from zirconium (Zr) and hafnium (Hf), at least one metal element from calcium (Ca), strontium (Sr), and barium (Ba), and at least one second element from vanadium (V), niobium (Nb), tantalum (Ta), scandium (Sc), yttrium (Y), and lanthanoid.

8. The device according to claim 7, wherein an atomic ratio of titanium to sum of titanium, zirconium, and hafnium in the conductive layer (Ti/(Ti+Zr+Hf)) is equal to or greater than 0.5 and equal to or less than 0.8.

9. The device according to claim 7, wherein a concentration of the at least one second element in the conductive layer is equal to or greater than $1 \times 10^{19}$ cm$^{-3}$.

10. The device according to claim 7, wherein the conductive layer contains metal oxide.

11. The device according to claim 7, wherein the conductive layer contains calcium titanate, strontium titanate, or barium titanate.

12. The device according to claim 7, wherein a concentration of an n-type impurity of the n-type SiC region is equal to or greater than $1 \times 10^{19}$ cm$^{-3}$.

13. The device according to claim 7, further comprising a p-type SiC region, wherein the metal layer is in contact with the p-type SiC region and the conductive layer.

14. The device according to claim 7, wherein the conductive layer contains lead (Pb).

15. The device according to claim 7, wherein temperature dependency of electric resistance of the conductive layer turns from negative dependency to positive dependency at a temperature equal to or greater than 150° C. and equal to or less than 200° C.

\* \* \* \* \*